AMPLIFIER AUTOMATIC GAIN CONTROL CIRCUIT

Filed June 14, 1944

INVENTOR.
J. R. WILKERSON
BY Paul B. Hunter
ATTORNEY

Patented Sept. 5, 1950 2,520,989

UNITED STATES PATENT OFFICE 2,520,989

AMPLIFIER AUTOMATIC GAIN CONTROL CIRCUIT

Jefferson R. Wilkerson, Bayside, N. Y., assignor to The Sperry Corporation, a corporation of Delaware Application June 14, 1944, Serial No. 540,322

1 Claim. (Cl. 179—171)

My invention relates to automatic gain control circuits, and concerns particularly automatic gain control circuits for pulse forming circuits and synchronizers.

It is an object of the present invention to provide an improved Peterson coil generator which is free from phase shift.

Still another object is to insure that the phase of the output pulse of a pulse generator is unaffected by changes in vacuum tube characteristics, variations in input voltage, or variations in voltage supply.

A further object is to provide a vacuum tube circuit having a non-sinusoidal output with delayed automatic volume control and negative feed-back supplied by a common connection.

Still another object of the present invention is to avoid variation in amplitude of the sine wave voltage applied to the Peterson coil of a pulse generator.

Other and further objects and advantages will become apparent as the decription proceeds.

In carrying out my invention in connection with range indicating object detecting systems of the microwave type, I provide a synchronizer including two pulse-generating circuits each responsive to sine wave voltage. One of the pulse-generating circuits is utilized as a transmitter trigger for releasing microwave pulses in accurately fixed phase relationship with respect to an input sine wave. The other pulse-former circuit is utilized for producing indicator time-reference pulses for range indication accurately set in phase. Range is indicated by comparison of the position of the reference pulse with a video signal received as a result of reflection of the transmitted wave in the event that an object is detected by intercepting the transmitted wave.

In carrying out the invention in its preferred form, each pulse generator circuit comprises a voltage amplifier and a power amplifier in cascade with a tuned series resonant circuit coupled to the output of the power amplifier and supplying current to a saturable core inductance of the Peterson coil type for producing sharp peaked waves or pips in synchronism with the sine wave input. Preferably, the circuit constants are so chosen that the amplifiers operate as class A amplifiers. I provide a negative feed-back stabilizing connection from the tuned circuit to the input of the power amplifier and I provide a delayed automatic volume control for the voltage amplifier energized by the same feed-back connection.

Copending divisional application Serial No. 41,116, filed July 28, 1948, discloses and claims the range-measuring system and the pulse-forming circuit disclosed herein.

A better understanding of the invention will be afforded by the following detailed description considered in conjunction with the accompanying drawing, in which Fig. 1 is a circuit diagram of a pulse generator forming an embodiment of my invention;

Like reference characters are utilized throughout the drawing to designate like parts.

Figure 1:
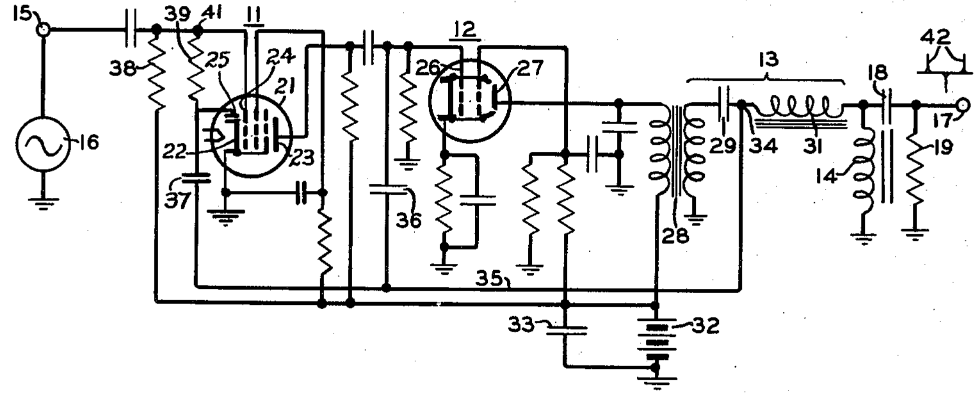

The circuit illustrated in Fig. 1 comprises a first stage amplifier 11 which may be a voltage amplifier, a second stage amplifier 12 which may be a power amplifier, a series-resonant tuned circuit 13 energized by the amplifier 12, a saturable-core reactor 14 in series with the tuned circuit 13, and means for obtaining an output voltage from the saturable-core reactor 14. An input terminal 15 is provided which is adapted to be connected to a source of sine-wave signal-frequency voltage represented schematically as a generator 16. The generator 16 may be a radio-frequency generator, but my invention is not limited to use with radio-frequency apparatus. An output terminal 17 is provided which is coupled to the saturable-core reactor 14 by a coupling condenser 18 and a load resistor 19.

For supplying delayed automatic volume control, a diode detector may be provided and for convenience the diode detector and the voltage or first stage amplifier may be combined in a single evacuated envelope 21 of a duplex tube, such as a diode-pentode tube of the 6SF7 type, for example. The envelope 21 contains a conventional cathode 22, shown as grounded, a conventional anode 23, an input signal grid 24 and conventional suppressor and screen grids, all of which form a pentode voltage amplifier. In addition, the envelope 21 contains a diode-anode 25, which, together with the cathode 22, forms an automatic volume control diode detector. Thus a single cathode serves both the pentode amplifier and the automatic-volume-control diode detector.

The power amplifier stage 12 may take the form of a beam power amplifier tube comprising the conventional electrodes including an input grid 26, resistance-capacitance coupled to the anode 23 of the voltage amplifier 11, and an anode 27 coupled to the tuned circuit 13. As shown, a coupling transformer 28 is provided for coupling the anode circuit of the power amplifier 12 to the tuned circuit 13.

The tuned circuit 13 includes a condenser 29 and an inductance coil 31 connected in series and having such constants as to be resonant at substantially the frequency of the input sine wave source 16, which may, for example, supply a voltage at 100 kilocycles per second.

The saturable-core reactor 14 connected in series with the tuned circuit 13 may be of the type having a core composed of a material such as Permalloy designed to saturate with minute exciting current and which may be constructed as described by Peterson, Manley and Wrathall in their article "Magnetic Generation of a Group of Harmonics" published in volume 16 of the Bell System Technical Journal for October 1937, pages 437 to 455, and also published in Electrical Engineering, August 1937.

For supplying anode current to the vacuum tube stages 11 and 12, a conventional source of unidirectional voltage is provided, here represented for convenience as a battery of cells 32, with a negative terminal grounded and a positive terminal by-passed by a condenser 33 to eliminate the signal-frequency impedance of the voltage source 32.

The common terminal 34 of the series resonant condenser 29 and inductance coil 31 is coupled by means of a conductor 35 and a condenser 36 to the input signal grid 26 of the power amplifier 12. The connections of the transformer 28 are such that the coupling circuit 36, 35 supplies negative feed-back or degeneration to the power amplifier 12.

For supplying the automatic volume control diode 25, 22, the conductor 35 is also coupled to the diode-anode 25 by means of a condenser 37. For setting the level above which the automatic volume control comes into effect and providing "voltage delay," the input signal grid 24 and the diode-anode 25 are positively biased by means of a pair of resistors 38 and 39 connected in series between the positive terminal of the power supply 32 and the diode-anode 25, the common terminal 41 of the series resistors 38 and 39 being connected to the signal input grid 24. Preferably the resistance of the resistor 39 is made less than that of the resistor 38.

Figure 3:
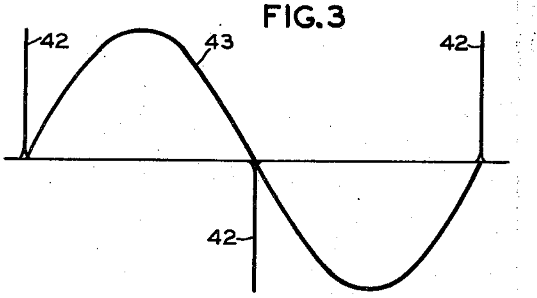
Fig. 3 is a graph illustrating the principle of operation of the pulse-generating circuit illustrated in Fig. 1.

The manner in which the sine wave input voltage is converted into sharp peaks of the wave form illustrated at 42 may be explained briefly as follows:

Since the stages 11 and 12 are operated as class A amplifiers, the sine wave voltage provided by the generator 16 will be applied with increased amplitude and pure sine wave to the tuned circuit 13 which, being resonant, will cause a substantially pure sine wave current to pass through the saturable-core reactor 14. Owing to the high degree of saturation of the core, however, the reactance thereof will vary greatly between the maximum value with small input current and a greatly reduced value with somewhat larger input currents. As a result, there is a switching effect and sharp voltage peaks 42 are produced at the cross-over points of the input sine wave 43, illustrated in Fig. 3. The principle of operation of this part of the circuit is described in greater detail in the aforesaid article in the Bell System Technical Journal.

Nevertheless, the precise phase relationship between the output pulse and the input sine wave depends, I have found, upon the magnitude of the sine wave current supplied to the saturable core reactor 14. The phase angle depends also upon the magnitude of the voltage supplied by the source 32 and is subject to variation with variations in tube characteristics caused by aging, variations in ambient temperature, etc. Some phase shift between the input and output waves is not objectionable, but any such phase shift must be held constant in order to obtain accuracy, precision and reliability in a ranging system.

The negative feed-back through the coupling condenser 36 stabilizes the power amplifier and overcomes phase angle variation from variation in supply voltage and tube characteristics. The delayed automatic-volume control provides for maintaining substantially constant the effective value of the sine wave current in the saturable-core reactor 14.

The manner in which delayed automatic volume control is obtained results from the novel connections employed. The resistors 38 and 39 in series form a voltage divider for supplying a predetermined D. C. level voltage to the grid 24. Furthermore, these resistors connect the diode-anode 25 to the positive terminal of the voltage supply 32. In the absence of automatic-volume-control voltage the grid 24 will draw slight grid current so that the grid is slightly positive. The tube 11 will then operate as an amplifier with approximately maximum gain. If it is assumed that the ratio of resistors 38 and 39 is 2.5:1 and the voltage of the source 32 is 250 volts, the grid 24 will continue to draw current until the rectified control voltage on the diode-anode 25 exceeds approximately 100 volts. At this point the grid 24 ceases to draw current and is drawn negative at about three-quarters of the rate at which the control voltage increases. This in turn reduces the gain of the amplifier 11 and so furnishes a very effective delayed automatic volume control.

Figure 2:
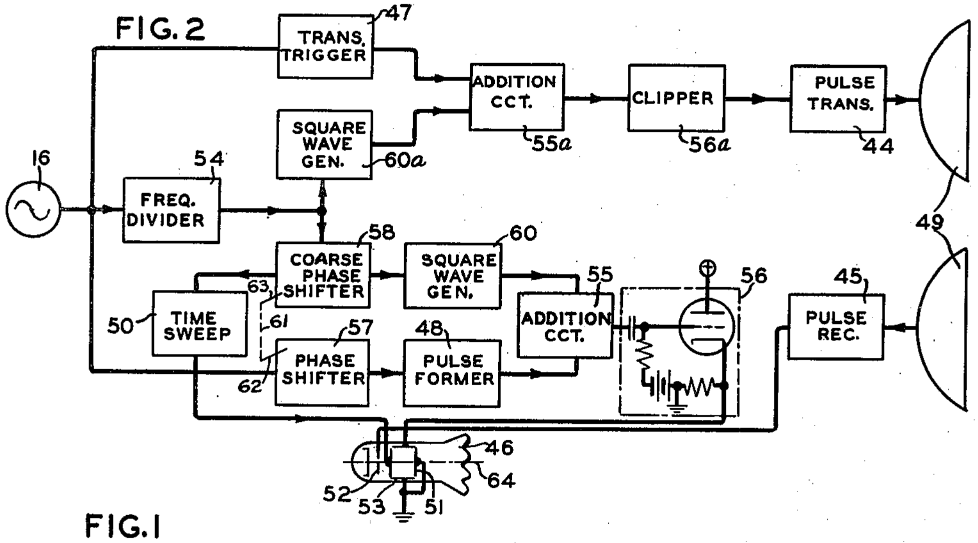
Fig. 2 is a schematic diagram of an object-detecting and range-indicating system, embodying my invention.

A highly precise object locating and range-measuring system utilizing pulse-forming circuits such as illustrated in Fig. 1 is shown in Fig. 2. The arrangement of Fig. 2 is a modification of the arrangement disclosed in the application of Joseph J. Caldwell, Jr., and Robert F. Hays, Jr., Serial No. 443,573, filed May 19, 1942. It will be understood that those parts of the system not essential to the understanding of the function of the pulse-forming circuits are either omitted or indicated only schematically.

The system of Fig. 2 comprises a pulse transmitter 44, a pulse receiver 45, a cathode ray tube 46, utilized as an indicator, an accurately maintained source of radio frequency such as a 100-kilocycle crystal oscillator represented by the sine wave source 16, a transmitter trigger circuit 47 for converting the output of the sine wave generator 16 into accurately phased trigger pulses for tripping the pulse transmitter 44, and a pulse former 48 for converting the output sine wave of the generator 16 into accurately phased pulses or pips to serve as range reference indications in the cathode ray tube 46.

The units 47 and 48 are pulse generators such as shown in Fig. 1.

A single antenna may be employed for the transmitter 44 and the receiver 45, but for the sake of simplifying the drawing, separate paraboloid type antennae 49 are shown.

The cathode ray tube 46, which is shown fragmentarily, comprises the conventional elements including a control grid 52 connected to the video output terminal of the pulse receiver 45, a time-sweep circuit including a sweep-generator 50 and deflection plates 51, and a transverse sweep circuit shown as comprising sweep plates 53, adapted to be coupled to the pulse former 48.

In order to provide for very precise indications of range the period of the transverse sweep wave applied to the sweep plates 53 may be made a small fraction of the maximum range of the system, in which case a sub-multiple transverse sweep wave is also required. As illustrated in Fig. 2, a frequency divider 54 may be provided which receives its input signal from the output of the sine wave generator 16. A square-wave generator 60 is interposed in the output of the frequency divider 54. For combining the outputs of the sub-multiple frequency square-wave generator 60 and the pulse former 48, an addition circuit 55 may be provided; and a biased cathode-follower circuit 56 or clipper may also be provided for preventing the output of the addition circuit 55 from reaching the sweep circuit including the plates 53 except when the output of the addition circuit exceeds the value of the peak voltage output of one of the devices 48 and 54.

Corresponding elements 60*a*, 55*a* and 56*a* are provided for causing the transmitter 44 to be triggered at the sub-multiple frequency at which the range indicator plates 53 are energized.

Figure 4:
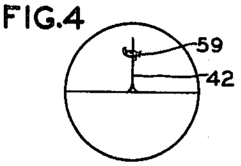
Fig. 4 is a diagram of the indicator screen with a graph explanatory of the principle of operation.

Although the horizontal scale of the screen of the tube 46, shown in Fig. 4, may be calibrated in terms of range, the range scale may be made independent of the degree of linearity of the circuits by means of a null system utilizing phase shifters 57 and 58 for adjusting the position of the reference pulse on the screen of the cathode ray tube 46 to coincide with the position of a video signal 59 produced by the pulse receiver 45 when the target is detected.

If it is assumed that the frequency divider 54 has a ratio of 20 to 1 a mechanical connection 61, such as a 20:1 reduction gear represented by a dotted line, may be provided between the control or adjusting arms 62 and 63 of the phase shifters 57 and 58 so that the latter serves as a coarse phase shifter.

The grid 52 of the cathode ray tube 46 is so biased that normally the tube 46 is reduced in intensity and it produces only a faint trace, but no bright indication or spot on the screen of the tube. However, when a video signal is received by the receiver 45 the grid 52 is energized more strongly and the bright spot 59 is produced upon the screen. If the clipper 56 were not employed, the cathode ray beam 64 would be swept along the screen transversely by the sweep circuit 53 so as to produce a trace corresponding to the sum of the peak output wave 42 of the pulse former 48 and the square output wave 65 of the square-wave generators 60 and 60*a* (Fig. 5).

Figure 5:
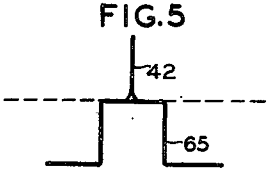
Fig. 5 is a graph explaining the manner of obtaining a vernier effect.

The bias of the cathode follower clipper 56 causes all of the wave of Fig. 5 to be eliminated except the marker 42 which produces such a trace on the screen of the cathode ray tube 46. The maximum range of the system is such that only one of the square pulses 65 supplied by the circuit 54 occurs during the time corresponding to maximum range. However, for the constants assumed 20 sharp pips 42 occur during the same period. Only one of these pulses 42 appears upon the screen of Fig. 4, namely, the one corresponding to the time period during which the square-wave 65 is applied to the screen circuit. For accuracy and precision of range indication, the phase angle of the pip 42 must remain constant for a given phase shifter setting regardless of any variations in strength of input signal, voltage supply or tube characteristics. The constant phase-angle pulse-generators 47 and 48 are therefore very important to the proper operation of the range-indicating system. Since the position of the square-wave 65 is determined by the setting of the coarse phase shifter 58 and the positions of the sharp pips 42 with respect to the square-waves 65 are determined with great precision and reliability by the setting of the phase shifter 57, the phase shifters may be so set as to cause the single reference pip 42 which appears upon the screen of Fig. 4 to intersect the video target 59 and the range may be read from the settings of the control arms 62 and 63 of the phase shifters 57 and 58 respectively.

It will be understood that the phase shifters 57 and 58 may be calibrated in phase angle, time duration, or preferably directly in range.

As many changes could be made in the above construction and many apparently widely different embodiments of this invention could be made without departing from the scope thereof, it is intended that all matter contained in the above description or shown in the accompanying drawing shall be interpreted as illustrative and not in a limiting sense.

What is claimed is:

In an amplifier system having first and second input terminals; an electron discharge means having an anode electrode means, control electrode means, and cathode means; means for applying the signal to be amplified to said control electrode means including a connection between said control electrode means and said first input terminal; said cathode means being connected to said second input terminal; a source of potential having its negative terminal connected to said second input terminal; a pair of resistances serially connected to the positive terminal of said source of potential; rectifier means including cathode means and anode means serially connected between said pair of resistances and the negative terminal of said source of potential; said rectifier cathode means and said electron discharge cathode means being at the same potential; means interconnecting the junction between said resistances and said control electrode; means for deriving an amplified version of said signal from the electron discharge anode means; and means for applying said amplified version of said signal voltage across said rectifier means.

JEFFERSON R. WILKERSON.

REFERENCES CITED

The following references are of record in the file of this patent:

UNITED STATES PATENTS

| Number | Name | Date |
|---|---|---|
| 1,971,646 | Farnham | Aug. 28, 1934 |
| 1,990,512 | Aiken | Feb. 12, 1935 |
| 2,046,141 | Wilhelm et al. | June 30, 1936 |
| 2,073,486 | Koch | Mar. 9, 1937 |
| 2,135,599 | Peterson | Nov. 8, 1938 |
| 2,146,091 | Peterson | Feb. 7, 1939 |
| 2,189,549 | Hershberger | Feb. 6, 1940 |
| 2,200,049 | Van Loon | May 7, 1940 |
| 2,203,004 | West | June 4, 1940 |
| 2,216,582 | Barton | Oct. 1, 1940 |
| 2,222,759 | Burnside | Nov. 26, 1940 |
| 2,225,046 | Hunter | Dec. 17, 1940 |
| 2,227,598 | Lyman et al. | Jan. 7, 1941 |